United States Patent
Bischof et al.

(10) Patent No.: US 7,279,888 B2
(45) Date of Patent: Oct. 9, 2007

(54) HANDLING UNIT FOR ELECTRONIC DEVICES

(75) Inventors: Andreas Bischof, Dresden (DE); Michael Adam, Neukirch (DE); Joerg Keller, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/170,190

(22) Filed: Jun. 29, 2005

(65) Prior Publication Data

US 2007/0001703 A1  Jan. 4, 2007

(51) Int. Cl.
*G01R 31/28* (2006.01)
(52) U.S. Cl. ............... 324/158.1; 324/765; 414/222; 209/573
(58) Field of Classification Search ............ 324/158.1, 324/765; 209/573–574; 702/108, 117
See application file for complete search history.

(56) References Cited

U.S. PATENT DOCUMENTS

| | | | | |
|---|---|---|---|---|
| 5,290,134 A | * | 3/1994 | Baba | 414/404 |
| 5,481,438 A | * | 1/1996 | Nemoto | 361/810 |
| 5,675,957 A | * | 10/1997 | Kim | 53/242 |
| 5,909,657 A | | 6/1999 | Onishi et al. | |
| 6,163,145 A | * | 12/2000 | Yamada et al. | 324/158.1 |
| 6,414,510 B1 | * | 7/2002 | Takeuchi et al. | 324/765 |
| 6,445,203 B1 | * | 9/2002 | Yamashita et al. | 324/760 |
| 6,459,259 B1 | * | 10/2002 | Ito et al. | 324/158.1 |
| 6,856,128 B2 | | 2/2005 | Ito et al. | |

* cited by examiner

*Primary Examiner*—Ha Tran Nguyen
*Assistant Examiner*—Arleen M. Vazquez
(74) *Attorney, Agent, or Firm*—Slater & Matsil, L.L.P.

(57) ABSTRACT

A handling unit includes a frame, at least one arrangement module, and at least one chip carrier. The frame has at least one recess for the interchangeable mounting of at least one of the arrangement modules. The arrangement module has at least one receptacle for the mounting of at least one chip carrier. The chip carrier has at least one chip seat for holding a chip.

23 Claims, 1 Drawing Sheet

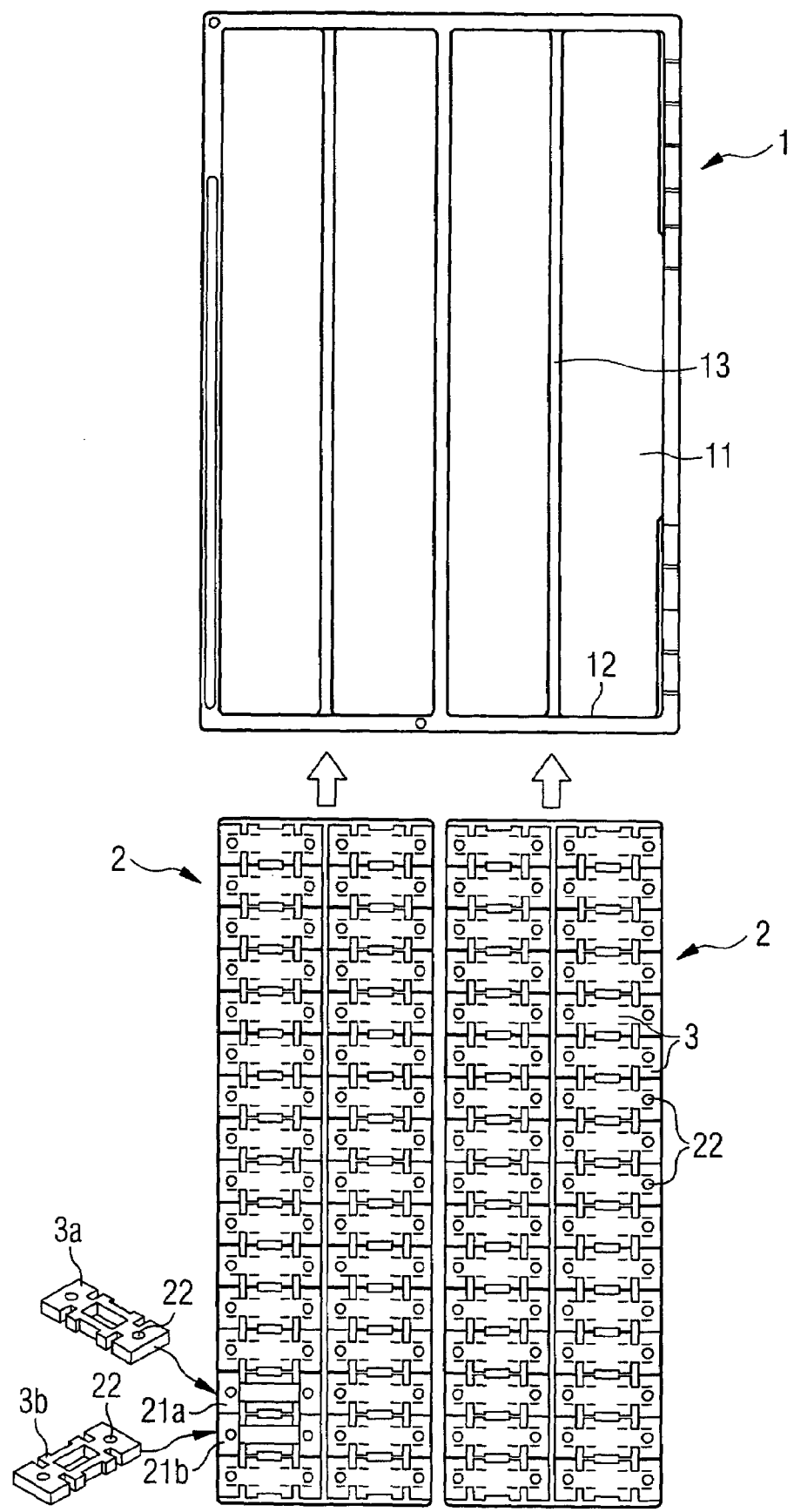

HANDLING UNIT FOR ELECTRONIC DEVICES

TECHNICAL FIELD

This invention relates to an improved handling unit for the testing of electronic devices such as integrated circuits ("ICs"), semiconductor chips and the like in order to decrease the cost of tools employed in these testing procedures, thus reducing the unit cost of such electronic devices.

BACKGROUND

In the electronics industry, there is a constant demand for electronic devices, such as integrated circuits (ICs) or semiconductor chips, to be produced less expensively and in smaller dimensions. One way to reduce the unit cost of such electronic devices is to increase the test speed of the devices by testing a plurality of them at the same time.

It has become a test technology standard to place a number of electronic devices to be tested on a test tray and position them so as to be engaged by a test head plate having a number of corresponding test contractors. On the test tray, a number of IC carriers are positioned by column and row. A handler (i.e., a handling device) withdraws electronic devices from a stack or magazine and places one device on an IC seat or in an IC pocket of each IC carrier. The test tray, having a number of such IC carriers, is then arranged so as to be in vertical alignment (either above or below) with a test fixture.

Such test trays have been described, for example, in U.S. Pat. No. 5,675,957 (Kim), U.S. Pat. No. 5,909,657 (Onishi et al.) and U.S. Pat. No. 6,856,128 (Ito et al.). Each of these patent references is incorporated herein by reference.

The test tray comprises a rectangular frame having one or more equally spaced apart parallel cleats between the opposed major side frame members of the frame, and a multiplicity of IC carriers mounted between each pair of opposed cleats and between each of the side frame members and the opposed cleats.

The exterior shape of the test tray is adapted for use with a certain type of handler, i.e., it is handler specific, whereas the shape and size of the IC carriers are adapted for use with a certain type of electronic devices, i.e., the IC carriers and their arrangement on the test tray are device specific. Therefore, it is necessary for the manufacturer of such electronic devices to have one specific tool for every combination of handlers and device types. This leads to great expenditures for such tools and increases the cost of production.

Thus, there is a need for a test tray with IC carriers (hereinafter called "handling unit") that can overcome the problems and disadvantages described above.

SUMMARY OF THE INVENTION

In one aspect, the present invention provides a handling unit that is compatible with a wide variety of handlers and electronic devices.

According to a first aspect of the present invention, the handling unit for the handling of chips in testing procedures comprises a frame, at least one arrangement module and at least one chip carrier. The frame has at least one recess for the interchangeable mounting of at least one of the arrangement modules. The arrangement module has at least one receptacle for the mounting of at least one chip carrier, and the chip carrier has at least one chip seat for holding a chip.

The handling unit according to embodiments of the invention splits up the known test trays into parts that are handler specific and parts which are not, e.g., parts that are chip specific. This is achieved by introducing an intermediary part, namely the so-called arrangement module. The arrangement module fits into the recess of the frame, while the chip carriers fit into the receptacles of the arrangement module. Thus, the arrangement module provides a link between handler specific parts and chip specific parts.

According to another aspect of the present invention, the frame comprises fastening means for fastening an arrangement module and/or the arrangement module comprises fastening means for fastening a chip carrier. Of course, a combination of these features is within the scope of the invention and is especially beneficial. In order to speed up the process of exchanging an arrangement module between two different frames, it is advantageous to choose fastening means that can be operated without the use of tools, e.g., clip-on mechanisms.

According to another aspect of the present invention, all recesses of the frame are of the same size.

By providing commensurate recesses it is ensured that an arrangement module can be mounted on any of the recesses of a frame. At the same time, the arrangement module can be mounted on any of a given number of frames. This feature can be freely combined with any of the foregoing features of the invention.

According to another aspect of the present invention, all arrangement modules are of the same size and are designed for the alternative mounting of chip carriers of different size.

While it is possible, according to this aspect of the invention, to have arrangement modules of the same size as the recesses of the frames, the arrangement modules could also be the size of a fraction of a recess, thus allowing for the attachment of more than one arrangement module in one recess. This is especially advantageous if arrangement modules are to be interchanged between greatly different frames with respect to size. For a given size of an arrangement module, it is advantageous to provide a design that allows attachment of different size chip carrier so that the arrangement modules can be utilized for different size chips by simply replacing the chip carriers.

This feature can be freely combined with any of the foregoing features of the invention. It is especially useful to have fastening means for fastening the chip carriers that deploy a clip-on mechanism in order to be able to adapt the arrangement plate for the handling of a different chip type.

BRIEF DESCRIPTION OF THE DRAWINGS

For a more complete understanding of the present invention, and the advantages thereof, reference is now made to the following descriptions taken in conjunction with the accompanying drawing, in which the FIGURE is a schematic depiction of a preferred embodiment of the invention.

DETAILED DESCRIPTION OF ILLUSTRATIVE EMBODIMENTS

The FIGURE provides a schematic depiction of a preferred embodiment of the invention, in which the handling unit comprises a frame, two arrangement modules and sixty-four chip carriers.

The frame 1 is made by milling a metal plate and has two recesses 11, each of which can hold one arrangement module 2. Each recess 11 has a fastener 12 such as for example a clip-on mechanism, which is designed to hold one arrangement module 2 in place. For higher stability, each recess 11 has a centrally arranged cleat 13. Both recesses 11 are of the same size.

The arrangement modules 2 are made by laser cutting thin metal blanks and are of the same size as the recesses 11 of the frame 1 and designed to fit into such recess 11. Each arrangement module 2 has receptacles such as for example 21a and 21b and fastening means 22 for fastening chip carriers such as for example chip carrier 3a and 3b, which can be arranged in two rows with sixteen chip carriers 3 per row. The fastening means 22 are bores in which clip-on pins or screws can be retained to affix chip carriers 3.

The handling unit in this configuration can hold a total of sixty-four chips to be handled in a testing procedure at the same time. The arrangement modules 2 can easily be interchanged. They can also be attached to any other frame 1 with a different shape as long as the frame 1 has recesses 11 that are adapted to hold the arrangement modules 2.

According to another aspect, the present invention provides a method of manufacturing a semiconductor chip. In this embodiment, a plurality of semiconductor chips are fabricated. A handling unit that includes a frame, at least one arrangement module, and at least one chip carrier is provided. The frame has at least one recess for the interchangeable mounting of at least one of the arrangement modules. The arrangement module has at least one receptacle for the mounting of at least one chip carrier, and the chip carrier has at least one chip seat for holding a chip. In this method, ones of the semiconductor chips are moved into the handling unit and tested.

Although the present invention and its advantages have been described in detail, it should be understood that various changes, substitutions and alterations can be made herein without departing from the spirit and scope of the invention as defined by the appended claims.

What is claimed is:

1. A handling unit for the handling of chips in testing procedures, the handling unit comprising:
   a frame having a perimeter portion selected to be compatible with a selected testing device, said frame defining at least one recess having a selected size;
   at least two one piece arrangement modules separate and distinct from said frame, said at least two arrangement modules readily interchangeably mounted in said at least one recess of said frame; and
   at least one chip carrier separate and distinct from said arrangement module; wherein:
   each of the at least two arrangement modules have at least one receptacle for the mounting of said at least one chip carrier; and
   the at least one chip carrier has at least one chip seat for holding a chip.

2. The handling unit according to claim 1, wherein the arrangement module comprises at least one fastener for fastening a chip carrier.

3. The handling unit according to claim 1, wherein said frame defines at least two recesses having the same said selected size.

4. The handling unit according to claim 1, wherein the frame has a plurality of recesses having the same said selected size and shape for the interchangeably mounting of a plurality of arrangement modules, wherein all arrangement modules are of the same size.

5. The handling unit according to claim 4, wherein at least one arrangement module of the interchangeable plurality of the arrangement modules is designed for mounting one or more chip carrier of a first size, and another one of said interchangeable arrangement modules is designed for mounting one or more chip carriers having a second size, said second size different from said first size.

6. The handling unit of claim 5, wherein said chip carrier of said first size has a chip seat for holding a chip having a first size and said chip carrier of said second size has a chip seat for holding a chip having a second size that is different from said first size.

7. The handling unit according to claim 1, wherein the frame has two recesses, each of the recesses arranged to hold one arrangement module.

8. The handling unit according to claim 1, wherein said at least one recess comprises two recesses each having the same said selected size.

9. The handling unit according to claim 1, wherein each of the one piece arrangement modules include two receptacles, each receptacle holding at least two rows of chips.

10. The handling unit according to claim 9, wherein the frame defines at least two recesses for mounting of at least two one piece arrangement modules and wherein each of the two one piece arrangement modules has two receptacles for mounting two chip carriers.

11. The handling unit according to claim 10, wherein each arrangement module holds at least 32 chips.

12. The handling unit of claim 1, wherein at least one of said arrangement modules mounted in said at least one recess is smaller than said selected size.

13. The handling unit of claim 1, wherein said at least two arrangement modules comprise a plurality of arranged modules and at least two of said plurality are mounted in a single one of said plurality of recesses.

14. A handling unit for the handling of chips in testing procedures, the handling unit comprising:
   a frame having a perimeter portion selected to be compatible with a selected testing device and defining a first recess and a second recess each having a selected size;
   a first one piece arrangement module separate and distinct from said frame and readily mounted and dismounted in one of the first and second recesses of the frame and said first arrangement module including a receptacle;
   a second one piece arrangement module separate and distinct from said frame and readily mounted and dismounted in the other one of the first and second recesses of the frame and said second arrangement module including a receptacle; and
   a first chip carrier separate and distinct from said arrangement modules arranged in the receptacle of the first arrangement module, the first chip carrier having at least one chip seat for holding a chip; and
   a second chip carrier arranged in the receptacle of the second arrangement module, the second chip carrier having at least one chip seat for holding a chip.

15. The handling unit according to claim 14, wherein the receptacles of the first and second arrangement modules are designed to accept chip carriers of the same size.

16. The handling unit according to claim 14, wherein the first arrangement module holds at least two rows of chips and wherein the second arrangement module holds at least two rows of chips.

17. The handling unit according to claim 16, wherein the first arrangement module holds exactly two rows of chips and wherein the second arrangement module holds exactly two rows of chips.

18. The handling unit according to claim 16, wherein each row of chips includes 16 chips so that the handling holds 64 chips.

19. The handling unit according to claim 14, wherein the handling holds 64 chips.

20. The handling unit according to claim 14, wherein the receptacles of the first and second arrangement modules are designed to accept chip carriers of different sizes.

21. The handling of claim 14, wherein said first chip carrier has a chip seat for handling a chip having a first size and said second chip carrier has a chip seat for handling a chip having second size, said second size being different than said first size.

22. The handling unit of claim 14, wherein said first and second arrangement module is smaller than said selected size.

23. The handling unit of claim 14, wherein said first one piece arrangement module comprises at least two arrangement modules mounted in one of said first and second recesses.

* * * * *